US008252260B2

(12) United States Patent
Iltis

(10) Patent No.: US 8,252,260 B2
(45) Date of Patent: Aug. 28, 2012

(54) RARE-EARTH HALIDE SINGLE CRYSTALS

(75) Inventor: Alain Iltis, Montigny sur Loing (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 0 days.

(21) Appl. No.: 13/206,941

(22) Filed: Aug. 10, 2011

(65) Prior Publication Data

US 2011/0293499 A1  Dec. 1, 2011

Related U.S. Application Data

(62) Division of application No. 12/641,840, filed on Dec. 18, 2009, now Pat. No. 8,021,636, which is a division of application No. 10/535,818, filed as application No. PCT/FR03/03356 on Nov. 13, 2003, now Pat. No. 7,670,578.

(30) Foreign Application Priority Data

Nov. 27, 2002  (FR) ..................................... 02 14856

(51) Int. Cl.
    *C01F 17/00* (2006.01)
(52) U.S. Cl. ...................................... 423/263
(58) Field of Classification Search .................. 423/21.1, 423/263
    See application file for complete search history.

(56) References Cited

U.S. PATENT DOCUMENTS

| | | | |
|---|---|---|---|
| 4,179,492 A | 12/1979 | Kruesi | |
| 5,478,498 A | 12/1995 | Kodama et al. | |
| 6,373,863 B1 | 4/2002 | Ohishi et al. | |
| 6,451,106 B1 | 9/2002 | Mayolet et al. | |
| 7,067,815 B2 | 6/2006 | Dorenbos et al. | |
| 7,067,816 B2 | 6/2006 | Dorenbos et al. | |
| 7,084,403 B2 | 8/2006 | Srivastava et al. | |
| 7,233,006 B2 | 6/2007 | Dorenbos et al. | |
| 7,608,201 B2 * | 10/2009 | Iltis | 252/301.4 H |
| 2005/0188914 A1 | 9/2005 | Iltis et al. | |

FOREIGN PATENT DOCUMENTS

| | | |
|---|---|---|
| JP | 06-135715 | 5/1994 |
| WO | 01/60944 | 8/2001 |
| WO | 01/60945 | 8/2001 |

OTHER PUBLICATIONS

Andriessen, J. et al: "Experimental and theoretical study of the spectroscopic properties of Ce3+ doped LaCl3 single crystals", Optics Communications, vol. 178, No. 4-6, pp. 355-363, May 2000. XP004204283.

Meyer, Gerd et al: "The ammonium chloride route to anhydrous rare earth chlorides—the example of YCl3", Inorg. Synth., vol. 25, pp. 146-150, 1989. XP008021415.

Meyer, Gerd et al: "The ammonium-bromide route to anhydrous rare earth bromides MBr3", Journal of the Less Common Metals, vol. 127, pp. 155-160, 1987. XP 008021446.

Egger, P. et al: "Czochralski grwoth of Ba2Y1—xErxCl7 ($0 < x \leq 1$) using growth equipment integrated into a dry-box", Journal of Crystal Growth, vol. 200, No. 3-4, pp. 515-520, Apr. 1999. XP004168216.

* cited by examiner

*Primary Examiner* — Steven Bos

(74) *Attorney, Agent, or Firm* — Oblon, Spivak, McClelland, Maier & Neustadt, L.L.P.

(57) ABSTRACT

The invention relates to a method of preparing a polycrystalline block of a halide of formula $A_e Ln_f X_{(3f+e)}$ in which Ln represents one or more rare earths, X represents one or more halogen atoms selected from the group consisting of Cl, Br and I, and A represents one or more alkali metals selected from the group consisting of K, Li, Na, Rb and Cs, e, which may be zero, being less than or equal to 3f, and f being greater than or equal to 1, having a low water and oxyhalide content, in which the method comprises heating a mixture of, on the one hand, at least one compound having at least one Ln—X bond and, on the other hand, a sufficient amount of $NH_4X$ in order to obtain the oxyhalide content, resulting in a molten mass comprising the rare-earth halide, the heating being followed by cooling, and the heating, after having reached 300° C., never going below 200° C. before the molten mass has been obtained. The blocks thus produced allow very pure single crystals having remarkable scintillation properties to be grown.

12 Claims, No Drawings

RARE-EARTH HALIDE SINGLE CRYSTALS

CROSS REFERENCE TO RELATED APPLICATIONS

This application is a division of U.S. patent application Ser. No. 12/641,840, filed on Dec. 18, 2009, now U.S. Pat. No. 8,021,636, which is a division of U.S. patent application Ser. No. 10/535,818, now U.S. Pat. No. 7,670,578, which is the U.S. National Stage of International Patent Application No. PCT/FR03/03356, filed on Nov. 13, 2003, all of which are incorporated herein by reference in their entireties. This application claims priority to French Patent Application No. 02/14856, filed on Nov. 27, 2002, which is incorporated herein by reference in its entirety.

BACKGROUND

Rare-earth halides (in what follows, Ln is used to denote a rare earth), especially when they are doped with cerium, and in particular cerium-doped $LnBr_3$ and cerium-doped $LnCl_3$, have very useful scintillation properties especially for applications in nuclear imaging and in spectroscopy (positron emission tomography or PET, gamma camera, oil prospecting and the like). To obtain these properties satisfactorily, it is necessary for these compounds to be obtained in the form of large crystals. Generally, these crystals are single crystals. In certain particular cases, they may be polycrystals, within which the crystals have one dimension of the order of one or more centimeters. However, rare earth halides are highly hygroscopic compounds that react with water and with air as soon as they are heated, forming very stable oxyhalides. It has in general been considered that oxyhalide contents of the order of 0.1% by weight were acceptable, the crystals obtained with these contents being sufficiently transparent in appearance. In addition, certain crystals, such as CsI:Tl, accommodate high oxygen contents (for example around 0.2% of CsOH) as far as the scintillation properties are concerned. Now, the Applicant has discovered that the scintillation properties, especially the luminous efficiency, that is to say the number of UV-visible photons emitted per MeV of energy of an incident particle, of rare-earth halides can be drastically improved by lowering the oxyhalide content in a rare-earth halide crystal below this value.

The Applicant therefore sought to develop manufacturing methods that result in rare-earth halides that are as pure as possible (especially as regards oxygen), that is to say the water content of which is very much less than 0.1% by weight and the oxyhalide content of which is less than 0.2% by weight, and even less than 0.1% by weight or indeed less than 0.05% by weight. Moreover, means have to be found for preserving (for example over several months) and handling these halides that allow this purity to be maintained. This is because the growth of the crystals (generally single crystals) is usually carried out in batch mode, which involves phases of putting them into storage and of removing them from storage, which phases are conducive to contamination of the rare-earth halide by the water and oxygen of air.

In addition, it is very difficult to produce an installation for preparing a rare-earth halide (as raw material for growing crystals, generally single crystals) that does not itself introduce a small quantity of water or oxygen resulting in the formation of an undesirable oxyhalide. This is because any installation is always imperfectly impermeable and also always contains a small quantity of adsorbed water, so that partial contamination is usual in this kind of preparation, and a high degree of oxidation by the impurities of the gaseous environment is generally expected, most particularly at high temperatures such as above 300° C. The invention also provides a solution from this standpoint since the method according to the invention results in a very pure rare-earth halide, even with an installation initially containing water, whether adsorbed, absorbed or in condensed phase, and even in the presence of a reasonable amount of water and oxygen in the atmosphere during the heating leading to melting.

SUMMARY OF THE INVENTION

The Applicant has discovered that crystals manufactured according to the invention can even have melting points substantially different from those mentioned in the literature, this being interpreted as an effect owing to the high purity of the crystals (especially a low oxychloride content) obtained thanks to the invention. Thus, an $LaCl_3$ crystal produced according to the invention has a crystallization temperature of 880° C., whereas the values published by the prior art are spread between 852 and 860° C. Likewise, an $LaBr_3$ crystal manufactured according to the invention has a crystallization temperature of 820° C., whereas the values published in the prior art are between 777° C. and 789° C.

The invention especially makes it possible to prepare single crystals having a particularly low scintillation decay time. The advantage of this is that it is desirable to have crystals whose scintillation peaks have the lowest possible decay time, as in this way the time resolution is improved. To make this measurement, the light intensity of the main peak is recorded over time. Thus, the invention allows the production of single crystals whose decay time of the main component is less than 40, and even less than 30 and even less than 20 nanoseconds. For the purpose of the present invention, X represents a halogen atom chosen from Cl, Br and I. The present invention does not relate to rare-earth fluorides because they are not hygroscopic and because their chemistry is highly specific.

The single crystals prepared according to the invention also have a particularly low energy resolution, especially less than 5%, or even less than 4% or even less than 3.5%.

The following conventional methods may be used to prepare a rare-earth halide:

1. vacuum dehydration of $LaX_3(H_2O)_7$ at 80° C.: but this method gives LaOX contents that are too high and results in crystals of low quality;

2. chlorination of solid $La_2O_3$ with HCl gas above 500° C.: this method is dangerous as it requires the use of large amounts of HCl gas—a toxic gas—and it is also very difficult to ensure on an industrial scale that the chlorination reaction is complete;

3. dehydration of $LaX_3(H_2O)_7$ in gaseous HX. This method is also dangerous because of the large amount of HX used; and 4. reaction of an $La_2O_3$ powder with gaseous $NH_4Cl$ at about 340° C.: this is very difficult to ensure on an industrial scale that the chlorination reaction is complete.

DETAILED DESCRIPTION OF EXEMPLARY EMBODIMENTS

The document "The ammonium-bromide route to anhydrous rare earth bromides $MBr_3$"; Journal of the Less-Common Metals, 127 (1987) 155-160 teaches the preparation of a rare-earth halide/ammonium bromide complex and its thermal decomposition at less than 20° C./hour in order to form a rare-earth halide, without ever reaching the melting point. By operating in this way, the halide retains a high specific surface area—greater than 0.1 m²/g—propitious to moisture absorption and to oxychloride formation. The fact of working at below 400° C. greatly limits the problems of corrosion of materials, and this is one of the reasons why it is preferred in the prior art to use such low temperatures. The prior art making use of compounds of the NH₄X type does not generally heat beyond 300 or 400° C., as at higher temperatures NH₄X disappears by sublimation and the rare-earth halide becomes particularly sensitive to oxidation from the traces of water and oxygen that are present in the gaseous environment.

As documents of the prior art, mention may also be made of WO 0160944, WO0160945 and U.S. Pat. No. 6,451,106.

The invention solves the abovementioned problems. The invention makes it possible to obtain a very pure rare-earth halide in the form of a polycrystalline block, especially one having a rare-earth oxyhalide content of less than 0.2% by weight, or even less than 0.1% by weight, or even less than 0.05% by weight or even less than 0.02% by weight, and a water content of less than 0.1% by weight.

The method of preparation according to the invention comprises a step of heating a mixture of, on the one hand, at least one compound having at least one Ln—X bond and, on the other hand, NH₄X, in which Ln represents a rare earth and X is chosen from Cl, Br and I, said compound and NH₄X possibly being combined, at least partially, within a complex, said step resulting in a molten phase comprising the intended halide, followed by a cooling step resulting in at least one solid block comprising said halide. The NH₄X, by reacting with the oxyhalides, acts as oxygen scavenger and consequently strips the rare-earth halide of its oxychlorides, given that these oxychlorides may come from the reaction between the water that is absorbed by the rare-earth halide and the rare-earth halide during the heating. This purification takes place according to the principle of the following reaction:

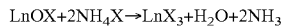

LnOX+2NH₄X→LnX₃+H₂O+2NH₃

The method according to the invention makes it possible in particular to prevent water, present in the mixture or the crucible or the apparatus, in adsorbed, absorbed or complexed form, from combining permanently with the rare-earth halide into the rare-earth oxychloride. Thus, the method according to the invention results in a final block having much less oxyhalide than the same method without the initial NH₄X. In particular, this may be observed with an installation difficult to strip of its adsorbed water, that is to say an installation that usually results in a high oxyhalide content (for example at least 0.2% oxyhalide) in the final halide even when no oxyhalide is intentionally put into the starting mixture (or a very low content, i.e. less than 100 ppm by weight) and even in the presence of the usual water and oxygen contents in the gaseous environment for this kind of manufacture.

The polycrystalline block obtained according to the invention is very pure. The invention combines, in a single heating step, the oxygen scavenging action, conferred by the presence of the ammonium halide, and the fact of immediately proceeding to melting the rare-earth halide so as to drastically reduce its specific surface area, thereby making it less moisture-sensitive while it is being stored and handled. The halide is therefore purified in a first stage and then melted in a second stage so as to become much less sensitive to oxidation by water and oxygen, these first and second stages being carried out within one and the same heating step, which means that, once the mixture has reached the temperature of 300° C., its temperature does not return to room temperature or even to a temperature below 200° C. before the desired rare-earth halide has been melted. This preparation of the block according to the invention is carried out in an inert or neutral atmosphere (for example in nitrogen or argon), but this atmosphere may even contain relatively large amounts of water and oxygen, that is to say in such a way that the sum of the water and oxygen masses in the gaseous atmosphere is less than 200 ppm by weight. In general, during production of the block according to the invention the water content of the inert atmosphere ranges from 10 to 180 ppm by weight and the oxygen content of the atmosphere ranges from 0.5 to 2 ppm by weight.

Because of its low specific surface area compared with a powder, the block absorbs fewer impurities from the air (moisture and oxygen) and consequently can be stored and handled while retaining a very high pure state. Under these conditions, this block can be used for preparing crystals (generally single crystals) of rare-earth halides that are very pure and of high quality.

The invention also relates to a method of preparing the blocks according to the invention in a carbon-rich crucible. Whereas according to the prior art, such as for example the article by P. Egger et al., J. Crystal Growth 200 (1999) 515-520, the growth of Ba₂Y₁₋ₓErₓCl₇ (0<x<1) in a glassy carbon crucible leads to contamination of the crystal because of the crucible, it turns out that the compositions forming the subject of the present invention are advantageously melted in a crucible that is rich in carbon, as is the case with glassy carbon, in order to produce the block according to the invention.

The rare earths Ln to which the present invention relates are those of Column 3 (according to the new notation) of the Periodic Table of the Elements, including Sc, Y, La, and the lanthanides from Ce to Lu. More particularly involved are the halides of Y, La, Gd and Lu, which may especially be doped with Ce or Pr.

The rare-earth halides more particularly involved in being manufactured in block form according to the present invention may be represented by the general formula $A_e Ln_f X_{(3f+e)}$ in which Ln represents one or more rare earths, X represents one or more halogen atoms chosen from Cl, Br or I, and A represents one or more alkali metals such as K, Li, Na, Rb or Cs, e and f representing values such that:

e, which may be zero, is less than or equal to 3f;

f is greater than or equal to 1.

The method according to the invention is more effective the lower the atomic number of X. Thus, the effectiveness of the method according to the invention in reducing the oxyhalide content in the final block increases, depending on the nature of X, in the following order: I<Br<Cl. The method according to the invention is more effective the larger the ionic radius of Ln. Thus, the effectiveness of the method according to the invention in reducing the oxyhalide content in the final block increases, depending on the nature of Ln, in the following order: Sc<Lu<Y<Gd<Pr<Ce<La.

The rare-earth halides more particularly involved are especially the following:

ALn₂X₇ in which Ln represents one or more rare earths, X represents one or more halogen atoms chosen from Cl, Br or I, A representing an alkali metal such as Rb and Cs;

LaCl₃, which may especially be doped with 0.1 to 50% by weight of CeCl₃;

LnBr₃, which may especially be doped with 0.1 to 50% by weight of CeBr₃;

LaBr₃, which may especially be doped with 0.1 to 50% by weight of CeBr₃;

GdBr₃, which may especially be doped with 0.1 to 50% by weight of CeBr₃;

$La_xLn_{(1-x)}X_3$, which may especially be doped with 0.1 to 50% of $CeX_3$, it being possible for x to range from 0 to 1, Ln being a rare earth different from La, X being a halogen as mentioned above;

$La_xGd_{(1-x)}Br_3$, which may especially be doped with 0.1 to 50% of $CeBr_3$, it being possible for x to range from 0 to 1;

$La_xLu_{(1-x)}Br_3$, which may especially be doped with 0.1 to 50% of $CeBr_3$, it being possible for x to range from 0 to 1;

$Ln'_xLn''_{(1-x)}X'_{3(1-y)}X''_{3y}$, in which Ln' and Ln" are two different rare earths of the Ln type, X' and X" being two different halogens of the X type, especially Cl and Br, it being possible for x to range from 0 to 1, and y to range from 0 to 1;

$RbGd_2Br_7$, which may especially be doped with 0.1 to 50% by weight of $CeBr_3$;

$RbLn_2Cl_7$, which may especially be doped with 0.1 to 50% by weight of $CeCl_3$;

$RbLn_2Br_7$, which may especially be doped with 0.1 to 50% by weight of $CeBr_3$;

$CsLn_2Cl_7$, which may especially be doped with 0.1 to 50% by weight of de $CeCl_3$;

$CsLn_2Br_7$, which may especially be doped with 0.1 to 50% by weight of $CeBr_3$;

$K_2LaCl_5$, which may especially be doped with 0.1 to 50% by weight of $CeCl_3$;

$K_2LaI_5$, which may especially be doped with 0.1 to 50% by weight of $CeI_3$.

The term "dopant" or "doped" refers to a rare earth present in a minor quantity that substitutes for one or more rare earths in a major quantity, the rare earths in a minor and major quantity both being denoted by the symbol Ln.

Thus, the invention may especially result in a block in which Ln is La or Ce and X is Cl or Br.

The invention relates especially to a method of preparing a block characterized in that it comprises a step of heating a mixture of, on the one hand, at least one compound having at least one Ln—X bond and, on the other hand, $NH_4X$, said compound and $NH_4X$ possibly being combined, at least partially, within a complex, said step resulting in a molten mass comprising the rare-earth halide of formula $A_eLn_fX_{(3f+e)}$, said heating step being followed by a cooling step after the molten mass has been obtained, and said heating step, after having reached 300° C. never going back down below 200° C. before said molten mass has been obtained.

The compound having at least one Ln—X bond may be of formula $A_rLn_sO_uX_{r+3s-2u}$ in which A, X and Ln have the meanings given above, r, s and u representing integer or noninteger values that meet, cumulatively, the following conditions:

r ranging from 0 to 2s, s being greater than or equal to 1, u ranging from 0 to s, which compound may or may not be complexed with water or with $NH_4X$.

In the compound having at least one Ln—X bond, Ln is in oxidation state 3 and, if A is present, this is in oxidation state 1. In particular, r may be zero. In particular, u may be zero.

Preferably, in the compound having at least one Ln—X bond, the amount of oxygen bonded to Ln is such that the amount of oxyhalide obtained by the dissolution method is less than 100 ppm by weight.

The compound having at least one Ln—X bond may be a rare-earth halide or a hydrated rare-earth halide. For example, it may be of formula $LnX_3$ or $LnX_3(H_2O)_n$ with n ranging from 1 to 10, or a mixture of several of the compounds whose formulae have just been given.

The compound having at least one Ln—X bond may also be a rare-earth oxyhalide. It may be of formula LnXO or a mixture of several of the compounds whose formulae have just been given. It is preferable to avoid the presence of LnXO in the starting mixture. Thus, preferably, the starting mixture contains less than 100 ppm by weight of LnXO. In general, this is a rare-earth halide in powder form containing a small proportion of oxyhalide and water. The mixture may also include a rare-earth oxyhalide/$NH_4X$ complex.

The mixture may also contain water, either in free form or in complexed form, for example complexed with the rare-earth halide. Surprisingly, the amount of water may be very high without this resulting in a higher oxyhalide content being obtained in the final polycrystalline block according to the invention, as long as the mixture contains a sufficient amount of $NH_4X$.

The mixture may even include, for example, up to 20% by weight of water, or more. It may also include, for example, less than 16% by weight of water, or even less than 5% by weight of water.

The mixture of, one the one hand, at least one compound having at least one Ln—X bond and, on the other hand, $NH_4X$, these two compounds being, where appropriate, at least partially in complexed form, contains sufficient $NH_4X$ for the final block to comprise less than 0.2% by weight of rare-earth oxyhalide, or even less than 0.1% by weight of rare-earth oxyhalide, or even less than 0.05% by weight of rare-earth oxyhalide, or even less than 0.02% by weight of rare-earth oxyhalide.

Preferably, the Ln atoms in the compound are linked only to X atoms or oxygen atoms or A atoms. This is particularly the case for a complex of formula $LnX_3.(NH_4X)_x$ in which the Ln atoms are linked only to X atoms. Here, it is considered that no atom belonging to $NH_4X$ is linked to the Ln atoms.

Preferably, an amount of $NH_4X$ which is at least the sum of the following two quantities:

A) a number of moles of $NH_4X$ equal to one and preferably three times the number of moles of Ln that are not linked to an oxygen;

B) is a number of moles of $NH_4X$ equal to three times and preferably five times the number of moles of oxygen atoms linked to Ln, is introduced into the mixture.

In particular, it is possible to introduce, into the mixture, an amount of $NH_4X$ which is at least the sum of the two following quantities:

A) a number of moles of $NH_4X$ equal to three times the number of moles of Ln that are not linked to an oxygen;

B) a number of moles of $NH_4X$ equal to five times the number of moles of oxygen atoms linked to Ln.

It is clearly understood that if $NH_4X$ is counted for the purpose of calculating A), the same $NH_4X$ must not be counted for the purpose of calculating B), and vice versa. If the mixture contains no oxygen linked to Ln, the amount of $NH_4X$ in the case of B) by itself is zero.

For the purpose of the present invention, it is considered that the number of moles of oxygen atoms linked to Ln is identical to the number of moles of oxyhalide of formula LnOX as obtained by the dissolution method described below. It is therefore easy to calculate, from the mass of oxyhalide obtained by the dissolution method, the number of moles of oxygen atoms linked to Ln by assuming that the oxyhalide has the formula LnOX. If A (generally Rb or Cs) is present, because this atom has a very low tendency to combine with oxygen, its presence is not involved in the calculations of the amounts of $NH_4X$.

It will be clearly understood that, to calculate this amount, it is necessary to take account of all the $NH_4X$ molecules present in the mixture, whether or not this $NH_4X$ is complexed, for example with a rare-earth halide.

The mixture may comprise a mixture of the compound having at least one Ln—X bond and $NH_4X$. This complex may, for example, be prepared by wet chemistry, according to the following principle:

a rare-earth salt, such as a rare-earth oxide or a hydrated rare-earth halide is firstly dissolved in the corresponding hydroacid (that is to say HCl if it is desired to obtain a chloride, HBr if it is desired to obtain a bromide). At this stage, AX (A generally being Rb or Cs) is added if a halide containing A is desired. Preferably, added to the ammonium halide solution are 1 to 4 moles of ammonium halide per mole of rare-earth halide, so as to obtain a solution. If it is desired finally to obtain a halide of the rare-earth Ln doped with another rare earth Ln' (in fact doped with a halide of Ln) such as cerium, all that is required is to introduce, during dissolution in the hydroacid, the desired proportion of Ln' (for example, 10% of $CeX_3(H_2O)_7$ into a solution obtained from $LaX_3(H_2O)_7$ if it is desired finally to obtain anhydrous $LnX_3$ doped with 10% of $CeX_3$).

The solution is then dried in an oven or by any suitable means. The salt obtained, of formula $LnX_3(NH_4X)_x$, where x=3.5, is stable and can be stored in sealed containers.

The mixture of, on the one hand, at least one compound having at least one Ln—X bond and, on the other hand, $NH_4X$ is then subjected to a heat treatment. For this heat treatment, the mixture is generally placed in a crucible, which may be made of platinum, carbon, such as graphite, or molybdenum or tantalum or boron nitride or silica. The crucible may also be made of graphite coated with pyrolytic carbon or made of graphite coated with silicon carbide or made of graphite coated with boron nitride. Preferably, for the melting, a crucible allowing the block to be demolded cold is used. To produce the blocks according to the invention, it is preferable to use a crucible made of a material containing at least 20% carbon by weight. Such a material may, for example, be carbon or graphite, or amorphous carbon (or glassy carbon) or graphite coated with pyrolytic carbon (also glassy carbon) or graphite coated with silicon carbide, or graphite coated with boron nitride (possibly pyrolytic). The crucible may therefore be coated with a layer of pyrolytic carbon. The material may comprise, on the one hand, a graphite substrate and, on the other hand, a coating, it being possible for this coating to be made of pyrolytic carbon or of silicon carbide or of boron nitride (possibly pyrolytic). The coating serves especially to block the pores in the graphite.

The crucible is then positioned in a sealed furnace, the atmosphere from which is purged in order to render it inert, for example purged under a low vacuum and then flushed with a stream of dry nitrogen. The temperature of the furnace is then progressively raised up to at least 400° C. The water from the complex is eliminated and then $NH_4X$ sublimes and is deposited on the cool downstream parts of the furnace. It is important for the mixture to be protected from the ambient air and to be completely in an inert atmosphere, especially above 300° C. and preferably above 200° C. This is why the potential air intakes into the installation are located beyond the point where the $NH_4X$ is deposited so that air cannot get back into the mixture being purified.

Owing to the fact that the $NH_4X$ is generally present in excess in the mixture, the actual temperature of the mixture generally presents a temperature hold corresponding to the temperature at which the $NH_4X$ is eliminated, even if the programmed temperature is constantly increasing. In the case of $NH_4Cl$, this temperature hold lies between 300 and 400° C. This applies not only if the $NH_4X$ is initially in free form but also if it is in complexed form. Because the heated mass contains much less $NH_4X$ after this temperature hold, it might be expected that the mixture would then be easily oxidized by the impurities present in the gaseous environment (presence of water and oxygen), and to be more so the high the temperatures (at this stage, the temperature of the heated mass is generally above 300° C.). The Applicant has discovered that this is not the case and that it is possible to control the oxidation of the rare-earth halide.

After the temperature hold during which the $NH_4X$ is given off, the temperature must then be rapidly increased up to a temperature sufficient to melt the desired rare-earth halide (for example, 880° C. in the case of $LaCl_3$). After the temperature hold at which the $NH_4X$ is given off, generally between 300 and 400° C., the mixture, already converted compared with the starting material (since it has lost the $NH_4X$), may be heated at a rate of greater than 50° C./hour and even greater than 100° C./hour and even greater than 150° C./hour and even greater than 200° C./hour. In general, the heating rate is less than 600° C./hour owing to the fact that it is generally necessary to protect the materials of the installation according to their thermal-shock resistance. When the heated material is molten, it is preferred to maintain a temperature above the melting point for at least one hour, generally between one and six hours.

As regards heating the mixture, once this is at a temperature above 300° C., its temperature is not brought back down to room temperature, or even to a temperature below 200° C., before the desired rare-earth halide has reached the melting point. It is preferable to heat the mixture until melting in a single heating step, without lowering the temperature, even momentarily, before the molten mass comprising the molten halide is obtained. The entire heating step (from room temperature up to melting) may generally be carried out in less than 10 hours, or even less than 6 hours or even less than 4 hours.

The molten mass can then be rapidly cooled. A block of anhydrous rare-earth halide is thus recovered, this comprising less than 0.1% by weight of water and less than 0.2% by weight of rare-earth oxyhalide, or even less than 0.1% by weight of rare-earth oxyhalide, or even less than 0.05% by weight of rare-earth oxyhalide or even less than 0.02% by weight of rare-earth oxyhalide. This block is easy to handle and to store. In general, blocks of at least 1 g per unit, or indeed at least 10 g per unit, or indeed at least 50 g per unit or indeed at least 500 g per unit may be produced. These blocks generally have a bulk density of at least 75%, or indeed at least 80%, or indeed at least 85% of the theoretical density, it being understood that the theoretical density is that corresponding to the same material without any porosity. The block according to the invention is polycrystalline and contains a multitude of grains, each of which is a small single crystal. A block generally contains at least 100 grains and even at least 1000 grains. No grain of the block represents more than 10% of the entire mass of the block.

The ammonium halide condensed on the cool downstream parts of the furnace may be at least partly reused, for example in the method according to the invention.

To measure the content of oxyhalides in a rare-earth halide, all that is required is to separate them using water (for example at room temperature) since the oxyhalides are insoluble in water whereas the halides are soluble. The oxyhalides may be recovered by filtration, for example over a polypropylene (PP) filter and then dried at 120° C. If the halide includes A (generally Rb or Cs), this method results in the dissolution of AX since A does not form an oxyhalide. This method, called the "dissolution method" of the "method of insolubles", results, even in the presence of A in the halide, in a determination of the content of oxyhalide of formula LnXO.

The block according to the invention may be used as raw material for growing crystals (generally single crystals) using known techniques such as Bridgman growth or Kyropoulos growth or Czochralski growth, or growth using the gradient freeze method. These single crystals are very pure and can be used as scintillator material. This crystal preparation is carried out in an inert atmosphere (nitrogen or argon for example), but this atmosphere may contain relatively large amounts of water and oxygen, that is to say in such a way that the sum of the water and oxygen masses in the gaseous atmosphere is less than 200 ppm by weight. In general, during production of the crystal (generally a single crystal), the water content of the inert atmosphere ranges from 10 to 180 ppm by weight and the oxygen content of the atmosphere ranges from 0.5 to 2 ppm by weight.

Because of the low surface area of the block or blocks used as raw material and also because this surface area increases during the rise in temperature up to melting, the final single crystal is very pure and has a remarkable scintillation efficiency. Thus, the invention also relates to a single crystal of formula $A_e Ln_f X_{(3f+e)}$, the symbols of which have the meanings given above, said single crystal comprising less than 0.2% and even less than 0.1%, or indeed less than 0.05% or indeed less than 0.02% by weight of rare-earth oxyhalide. This applies especially when Ln is chosen from La, Gd, Y, Lu and Ce, and when X is chosen from Cl and Br. Reference may more particularly be made to the following single crystals:

those of general composition $Ln_{1-x}Ce_xBr_3$ in which Ln is chosen from lanthanides or mixtures of lanthanides of the group La, Gd, Y and Lu, especially chosen from lanthanides or groups of lanthanides of the group La and Gd, and in which x is the molar degree of substitution of Ln with cerium, where x is greater than or equal to 0.01 mol % and strictly less than 100 mol %;

those of general composition $Ln_{1-x}Ce_xCl_3$, in which Ln is chosen from lanthanides or mixtures of lanthanides of the group Y, La, Gd and Lu, especially from elements or mixtures of elements of the group La, Gd and Lu, and in which x is the molar degree of substitution of Ln with cerium, where x is greater than or equal to 1 mol % and strictly less than 100 mol %.

The abovementioned growth methods may result in a large single crystal, that is to say one at least 1 cm³, or indeed at least 10 cm³ and even at least 200 cm³ in size. This single crystal may then be cut to the sizes suitable for the desired applications.

The single crystal according to the invention, because of its high purity, has a particularly high luminous efficiency. One way of measuring this luminous efficiency is to measure it relative to that of a crystal of NaI doped with 600 ppm by weight of Tl iodide, the energy resolution of which at 622 keV is 6.8%, the integration time being 1·mu·s and the radioactive source being $^{137}Cs$ at 622 keV. The coupling between the crystals (NaI or rare-earth halide) and the photomultiplier takes place by means of a silicone grease that is transparent up to 320 nm. Of course, the exit face of the NaI turned toward the photomultiplier is polished. Under these measurement conditions, the invention makes it possible to obtain luminous efficiencies of at least 90% of that of the Tl—NaI crystal, and in any case greater than those obtained on crystals not according to the invention.

The crystal or single crystal may especially be produced in a crucible made of platinum or graphite or graphite coated with pyrolytic carbon.

In the examples that follow, the energy resolution was measured in the following manner: a 10×10×5 mm piece is cut from the single crystal. All the faces of the piece apart from one of the large 10×10 mm faces are left as cut and the face with which the photomultiplier (PMT) couples is polished. The crystal is wrapped in several thickness of PTFE (Teflon) tape except on the face that is coupled to the PMT. The crystal is prepared in a glove box, the dew point of which is below −40° C.

EXAMPLES

Example 1

Anhydrous $LaCl_3$ 433 g of $La_2O_3$ were dissolved by 1380 ml of 37% HCl diluted in 2450 ml of water. 497 g of $NH_4Cl$ were added. Next, the water and HCl in excess were evaporated by heating to 100° C. in order to obtain an $LaCl_3.(NH_4Cl)_{3.5}$ complex, which contained 0.7% by weight of water using the Karl Fischer measurement. The $LaCl_3.(NH_4Cl)_{3.5}$ complex was a compound that did indeed have at least one Ln—X bond, since it contained La—Cl bonds. It was also itself a mixture within the meaning of the invention, comprising, on the one hand, a compound having an Ln—X bond and, on the other hand, $NH_4X$ (in this case $NH_4Cl$). Moreover, within this mixture, the amount of $NH_4X$ is such that the ratio of the number of moles of $NH_4X$ to the number of moles of Ln not linked to oxygen is 3.5, which corresponds to a preferred ratio according to the invention. Moreover, it was unnecessary to include in our calculations for $NH_4X$ being introduced in the case of oxygen linked to Ln since the starting mixture did not contain this type of bond.

By heating at a rate of 200° C./hour from room temperature up to 950° C., 200 g of the complex were then decomposed with sublimation of the $NH_4Cl$ and melted in a crucible made of graphite coated with pyrolytic carbon, said crucible itself being placed in a sealed silica tube with a nitrogen flush. The nitrogen atmosphere contained about 50 ppm by weight of water and between 1 and 2 ppm oxygen by weight. The oxychloride content in the final block, measured by dissolution, was 0.01% by weight. The water content was less than 0.1% by weight (the detection limit of the method used). The block obtained had a mass of 651 g.

Example 2

(Comparative Example): Anhydrous $LaCl_3$

The procedure was exactly as in the case of example 1, except that the complex was replaced with an anhydrous $LaCl_3$ powder whose oxychloride content was less than 0.02%, the size of the particles was submillimetric and the water content was not detectable by Karl Fischer.

The oxychloride content in the final block, measured by dissolution, was 0.23% by weight. The water content was less than 0.1% by weight.

Example 3

Anhydrous $LaBr_3$:Ce 300 g of $La_2O_3$ were dissolved by 630 ml of 47% HBr diluted in 2330 ml of water. 682 g of $NH_4Br$ were added. The solution obtained was filtered over PP. The solution was then dried with a rotary evaporator in a 10 l flask. The complex obtained, of formula $LaBr_3.(NH_4Br)_{3.5}$, contained 0.23% water by weight measured using Karl Fischer. Next, 142.6 g of this complex was removed and doped with 0.5% by weight of $(NH_4Br)_{3.5}.CeBr_3$, and this was heated at 200° C./h in a stream of nitrogen in a graphite crucible. The temperature was held at 860° C. for 4 h 30. The nitrogen atmosphere contained approximately 50 ppm by weight of water and between 1 and 2 ppm by weight of oxygen. The melted pellet weighed 76.61 g and contained only 0.035% oxybromide LaOBr (measured by the method of insolubles). The water content was also less than 0.1%.

The hydrostatic density of this block, measured by immersion in hexane, was approximately 4.92 g/cm$^3$, i.e. 87% of the theoretical density, thereby proving good densification.

This melted block was then used for growth in a Bridgman furnace in a graphite crucible under a stream of nitrogen. The nitrogen atmosphere contained approximately 50 ppm by weight of water and between 1 and 2 ppm by weight of oxygen. The crystal obtained was clear and free of white oxybromide inclusions and free of bubbles. The oxybromide content of this crystal was 0.05% by weight. More than 80% of the mass of this crystal was suitable for use as a scintillator.

Example 4

Anhydrous LaBr$_3$ from a Wet Complex

The complex $LaBr_3.(NH_4Br)_{3.5}$ prepared as in the preceding example was used, but wetted so that it contained 14.7% by weight of water measured by Karl Fischer. 124 g of this mixture (complex+water) were removed and heated at 200° C./h in a stream of nitrogen in a graphite crucible up to 860° C. The temperature was held at 860° C. for 4 h 30. The nitrogen atmosphere contained approximately 50 ppm by weight of water and between 1 and 2 ppm by weight of oxygen. The melted pellet weighed 64.1 g and contained only 0.034% by weight of oxybromide (measured by the method of insolubles). The water content was less than 0.1% by weight.

Example 6

Anhydrous GdBr$_3$ 271.2 g of $Gd_2O_3$ were dissolved by 796 g of 48% HBr diluted in 430 g of water. Next, 661.2 g of $NH_4Br$ and 855 g of water were added. The solution obtained was filtered over PP. The solution was then dried in a rotary evaporator in a 10 l flask. 1164 g of the complex $(NH_4Br)_{4.5}.GdBr_3$ were then obtained. The complex obtained contained 6.3% water measured by Karl Fischer. Next, 254.7 g of this complex were removed and heated at 200° C./h in a stream of nitrogen in a graphite crucible. The temperature was held at 815° C. for 1 h 30. The nitrogen atmosphere contained approximately 50 ppm by weight of water and between 1 and 2 ppm by weight of oxygen. The sintered but unmelted pellet weighed 104.9 g. It was therefore a pulverulent solid that was returned to the ambient conditions. The furnace was recharged with 92.7 g of the above sintered pellet and this was heated at 200° C./h under a stream of nitrogen in a graphite crucible. The temperature was held at 840° C. for 1 h 30. The nitrogen atmosphere contained approximately 50 ppm by weight of water and between 1 and 2 ppm by weight of oxygen. The melted pellet weighed 92.7 g and contained 0.65% by weight of GdOBr (measured by the method of insolubles), thereby demonstrating the fact that returning the block to room temperature before melting is contraindicated.

Example 7

Anhydrous GdBr$_3$

The complex $(NH_4Br)_{4.5}.GdBr_3$ as prepared according to the preceding example was used for this test. The complex obtained contained 6.3% by weight of water measured by Karl Fischer. Next, 245.7 g of this complex were removed and heated at 200° C./h in a stream of nitrogen in a graphite crucible up to 840° C. The temperature was held at 840° C. for 1 h 30. The nitrogen atmosphere contained approximately 50 ppm by weight of water and between 1 and 2 ppm by weight of oxygen. The melted pellet weighed 105.3 g and contained only 0.038% by weight of oxybromide GdOBr (measured by the method of insolubles). This result is all the more exemplary owing to the fact that gadolinium is a heavy (so-called yttric) rare earth whose bromides are very sensitive to hydration.

Example 8

(Comparative Example): Single Crystal from LaCl$_3$ Powder

The same batch of anhydrous LaCl$_3$ powder was used as that used for example 2 for Bridgman furnace growth in a graphite crucible in a stream of nitrogen. The nitrogen atmosphere contained approximately 50 ppm by weight of water and between 1 and 2 ppm by weight of oxygen. The crystal obtained had many white oxychloride inclusions and bubbles organized in the form of filaments along the pulling axis. The oxychloride content of this crystal was 0.25% by weight. Approximately 90% of the mass of this crystal was unsuitable for use as a scintillator.

Example 9

Anhydrous RbGd$_2$Cl$_7$ 138.2 g of $Rb_2CO_3$ were dissolved by 242 g of 37% HCl diluted in 165 g of water. The solution obtained was filtered over PP. Next, 433.8 g of $Gd_2O_3$ were dissolved by 750 g of 37% HCl diluted in 482 g of water. After complete dissolution, the filtered rubidium solution was added. Finally, 576.2 g of $NH_4Cl$ and 881 g of water were added. The solution obtained was filtered over PP. The pH was −0.32 and the density of the solution was 1.24. The solution was then dried in a rotary evaporator in a 10 l flask. 1227 g of $(NH_4Cl)_g.RbGd_2Cl_7$ were then obtained. Next, 142.6 g of this complex were removed and heated at 200° C./h in a stream of nitrogen in a graphite crucible up to 660° C. The temperature was held at 660° C. at for 4 h 30. The nitrogen atmosphere contained approximately 50 ppm by weight of water and between 1 and 2 ppm by weight of oxygen. The melted pellet contained only less than 0.05% by weight of GdOCl (measured by the method of insolubles).

Example 10

Synthesis from LaOBr

The following mixture was produced in a glassy carbon crucible: 0.5874 g of LaOBr, 1.3585 g of $NH_4Br$ (i.e. 5.5 moles) and 10.0678 g of the $(NH_4Br)_{3.5}.LaBr_3$ complex. The mixture was heated at a rate of 200° C./h up to 830° C., with a hold at this temperature for 2 h. The nitrogen atmosphere contained approximately 50 ppm by weight of water and between 1 and 2 ppm by weight of oxygen. The insoluble content in the final block was 0.19% by weight.

Example 11

LaCl$_3$ Single Crystal

A 1 kg block of LaCl$_3$ containing 10% CeCl$_3$ by weight was used, this being manufactured according to the invention and having an LaOCl content of less than 0.05% by weight. This block was then used for Bridgman-type growth in a graphite crucible. The nitrogen atmosphere contained approximately 50 ppm by weight of water and between 1 and 2 ppm by weight of oxygen. The crystal obtained was very clear. Its oxychloride content measured by the method of insolubles was less than 0.05%. Next, a piece measuring 10×10×5 mm was cut from this crystal and its scintillation efficiency compared with a piece of NaI:Tl (NaI doped with 600 ppm by weight of Tl iodide) using the following protocol:

| | |
|---|---|
| Photomultiplier: | Hamamatsu R-1306; |
| Reference: | NaI crystal 50 mm in diameter and 50 mm in length; |
| Integration time: | 1 µs |
| Radioactive source: | $^{137}$Cs at 622 keV. |

The light emission from the LaCl$_3$ crystal was 93% of that of the NaI reference crystal. Its energy resolution was 3.6%. The main component of the decay time of the scintillation was 27 nanoseconds.

Example 12

(Comparative Example): LaCl$_3$ Single Crystal 1 kg of commercial LaCl$_3$ and CeCl$_3$ powders (LaOX and water contents of example 2) were used. The mass of CeCl$_3$ represented 10% of the mass of the blend of these two powders. They were melted in a graphite crucible and underwent growth of the Kyropoulos (KC 01) type. The nitrogen atmosphere contained approximately 50 ppm by weight of water and between 1 and 2 ppm by weight of oxygen. The crystal obtained was slightly milky. Its content of insolubles was 0.1% by weight. Next, a 10×10×5 mm piece was cut from this crystal and its scintillation yield compared with a NaI:Tl using the same protocol as in the previous example. The light emission from the LaCl$_3$ crystal was 83% of that of the NaI reference crystal. Its energy resolution was 3.9%.

Example 13

(Comparative Example): LaCl$_3$ Single Crystal

A crystal was produced by Bridgman-type growth in a silica crucible in accordance with the teaching of the publication IEEE Transactions on Nuclear Science: "Scintillation properties of LaCl$_3$ crystals: Fast, efficient and High Energy resolution scintillators". The mass of CeCl$_3$ represented 10% of the mass of the mixture before growing the crystal. Next, a 10×10×5 mm piece was cut from this crystal and its scintillation yield compared with a NaI:Tl piece using the same protocol as in the two previous examples. The light emission from the LaCl$_3$ crystal was 87% of that of the NaI reference crystal. Its energy resolution was 4.2%.

Example 14

LaBr$_3$ Single Crystal

Three 1 kg blocks of LaBr$_3$ doped with 0.5% by weight of CeBr$_3$ were used, each block manufactured according to the invention and such that the LaOBr content was <0.05% by weight. This block was then used for Czochralski-type growth in a graphite crucible. The nitrogen atmosphere contained approximately 50 ppm by weight of water and between 1 and 2 ppm by weight of oxygen. The crystal obtained was very clear. The oxychloride content of this block could not be measured by the method of insolubles. Next, a 10×10×5 mm piece was cut from this crystal and its scintillation yield compared with a NaI:Tl piece according to the following protocol:

Photomultiplier: Hamamatsu R-1306

Reference: NaI:Tl crystal (NaI doped with 600 ppm by weight of Tl iodide) 50 mm in diameter and 50 mm in length;

The energy resolution of this reference crystal was 6.8% on the $^{137}$Cs line;

the measured crystals were wrapped in Teflon and coupled to the photomultiplier (PMT) using a silicone oil (EDM fluid 200);

Integration time: 1 µs

Radioactive source: $^{137}$Cs at 622 keV

The light emission from the LaBr$_3$ crystal was 147% of that of the NaI reference crystal. Its energy resolution was 4.2%. The main component of the decay time of the scintillation was 39 nanoseconds.

Example 15

(Comparative Example): LaBr$_3$ Single Crystal

A crystal obtained by Bridgman-type growth in a silica crucible according to the teachings of the publication "Applied Physics Letters of 3 Sep. 2001 (Vol. 79, No. 10)" was compared with the previous trials. This crystal also contained 0.5% by weight of CeBr$_3$. Next, a 10×10×5 mm piece was cut from this crystal and its scintillation yield compared with a NaI:Tl piece using the same protocol as in the previous example. The crystal was slightly milky.

The light emission from the LaBr$_3$ crystal was 102% of that of the NaI reference crystal. The main component of the decay time of the scintillation was 38 nanoseconds.

Example 16

LaCl$_3$ Single Crystal

Three 1 kg blocks of LaCl$_3$ doped with 5% by weight of CeCl$_3$ were used, each manufactured according to the invention and such that the LaOCl content was <0.05% by weight. This block was then used for Bridgman-type growth in a graphite crucible. The nitrogen atmosphere contained approximately 50 ppm by weight of water and between 1 and 2 ppm by weight of oxygen. The crystal obtained was very clear. The oxychloride content of this block could not be measured by the method of insolubles. It was less than 0.05% by weight. Next, a 10×10×5 mm piece was cut from this crystal and its scintillation yield compared with a NaI:Tl piece according to the following protocol:

Photomultiplier: Hamamatsu R-1306

Reference: NaI:Tl crystal (NaI doped with 600 ppm by weight of Tl iodide) 50 mm in diameter and 50 mm in length;

The energy resolution of this crystal was 6.8% on the $^{137}$CS line;

the measured crystals were wrapped in Teflon and coupled to the photomultiplier (PMT) using a silicone oil (EDM fluid 200);

Integration time: 1 µs

Radioactive source: $^{137}$Cs at 622 keV

The light emission from the LaCl$_3$ crystal was 98% of that of the NaI reference crystal. Its energy resolution was 4.6%. The main component of the decay time of the scintillation was 28 nanoseconds.

Example 17

Anhydrous LaCl$_3$

This example was as in example 1 except that the block was prepared in a platinum crucible. The final block stuck to the crucible and was much more difficult to remove from the mold than in the case of the graphite crucible coated with pyrolytic carbon.

Where a numerical limit or range is stated herein, the endpoints are included. Also, all values and subranges within a numerical limit or range are specifically included as if explicitly written out.

Obviously, numerous modifications and variations of the present invention are possible in light of the above teachings It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A single crystal of formula $A_eLn_fX_{(3f+e)}$ in which Ln represents one or more rare earths, X represents one or more halogen atoms selected from the group consisting of Cl, Br and I, and A represents one or more alkali metals selected from the group consisting of K, Li, Na, Rb and Cs, e and f representing values such that:

e, which may be zero, is less than or equal to 3f; and f is greater than or equal to 1;

comprising less than 0.1% by weight of rare-earth oxyhalide.

2. The single crystal as claimed in claim 1, having an oxyhalide content less than 0.05% by weight.

3. The single crystal as claimed in claim 2, having an oxyhalide content less than 0.02% by weight.

4. The single crystal as claimed in claim 1, wherein Ln is selected from the group consisting of La, Gd, Y, Lu and Ce, and X is selected from the group consisting of Cl and Br.

5. The single crystal as claimed in claim 1, wherein the single crystal has a volume of at least 10 cm$^3$.

6. The single crystal as claimed in claim 1, wherein the single crystal has a luminous efficiency at least 90% of that of a NaI crystal doped with 600 ppm by weight of Ti iodide, the energy resolution of which at 622 keV is 6.8%, the integration time being 1 µs, and the radioactive source being $^{137}$Cs at 622 keV.

7. The single crystal as claimed in claim 1, which has an energy resolution less than 5%.

8. The single crystal as claimed in claim 7, which has an energy resolution less than 4%.

9. The single crystal as claimed in claim 8, which has an energy resolution less than 3.5%.

10. The single crystal as claimed in claim 1, wherein the time for X to decay is less than 40 nanoseconds.

11. The single crystal as claimed in claim 10, wherein the time for X to decay is less than 30 nanoseconds.

12. The single crystal as claimed in claim 11, wherein the time for X to decay is less than 20 nanoseconds.

* * * * *

UNITED STATES PATENT AND TRADEMARK OFFICE
CERTIFICATE OF CORRECTION

PATENT NO.         : 8,252,260 B2
APPLICATION NO.    : 13/206941
DATED              : August 28, 2012
INVENTOR(S)        : Alain Iltis It is certified that error appears in the above-identified patent and that said Letters Patent is hereby corrected as shown below:

Title Page, Item 57 line 14-15 "300°C." should read --300°C--
Title Page, Item 57 line 15 "200°C." should read --200°C--

In the Specifications
Column 2 line 19 "880°C." should read --880°C--
Column 2 line 22 "820°C." should read --820°C--
Column 2 line 23 "777°C." should read --777°C--
Column 2 line 43 "80°C." should read --80°C--
Column 2 line 46 "500°C." should read --500°C--
Column 2 line 55 "340°C." should read --340°C--
Column 2 line 65 "20°C." should read --20°C--
Column 3 line 3 "400°C." should read --400°C--
Column 3 line 7 "400°C." should read --400°C--
Column 3 line 63 "300°C." should read --300°C--
Column 3 line 65 "200°C." should read --200°C--
Column 5 line 44 "300°C." should read --300°C--
Column 5 line 44 "200°C." should read --200°C--
Column 7 line 57 "300°C." should read --300°C--
Column 8 line 7 "300°C." should read --300°C--
Column 8 line 13 "880°C." should read --880°C--
Column 8 line 15 "400°C." should read --400°C--
Column 8 line 17 "50°C." should read --50°C--
Column 8 line 18 "100°C." should read --100°C--
Column 8 line 19 "150°C." should read --150°C--
Column 8 line 20 "200°C." should read --200°C--
Column 8 line 27 "300°C." should read --300°C--
Column 8 line 28 "200°C." should read --200°C--
Column 10 line 19 "100°C." should read --100°C--
Column 10 line 34 "200°C." should read --200°C--
Column 10 line 35 "950°C." should read --950°C--

Signed and Sealed this
Fourteenth Day of May, 2013

Teresa Stanek Rea
*Acting Director of the United States Patent and Trademark Office*